United States Patent
Kamitani et al.

(10) Patent No.: US 6,384,609 B1
(45) Date of Patent: May 7, 2002

(54) METHOD OF MEASURING INSULATION RESISTANCE OF CAPACITORS

(75) Inventors: Gaku Kamitani, Otsu; Hiroaki Nagai, Omihachiman, both of (JP)

(73) Assignee: Murata Manufacturing Co., Ltd., Nagaokakyo (JP)

(*) Notice: Subject to any disclaimer, the term of this patent is extended or adjusted under 35 U.S.C. 154(b) by 0 days.

(21) Appl. No.: 09/337,679

(22) Filed: Jun. 22, 1999

(30) Foreign Application Priority Data

Jun. 22, 1998 (JP) .......................................... 10-174183
May 31, 1999 (JP) .......................................... 11-151198

(51) Int. Cl.[7] ............................................... G01R 31/12
(52) U.S. Cl. ...................................................... 324/548
(58) Field of Search ................................. 324/548, 659, 324/678, 658, 652, 618, 663, 537

(56) References Cited

U.S. PATENT DOCUMENTS

| 5,262,729 A | 11/1993 | Kawabata et al. | |
|---|---|---|---|
| 6,043,665 A | * | 3/2000 | Nishioka et al. ............ 324/678 |

FOREIGN PATENT DOCUMENTS

| DE | 3127703 A1 | 2/1983 |
|---|---|---|
| DE | 68920886 T2 | 6/1990 |
| DE | 1992855.1-35 | 7/2000 |
| JP | 53-037471 | 4/1978 |

OTHER PUBLICATIONS

English Translation of 199 28 555.1–35 Office Action.

\* cited by examiner

Primary Examiner—Safet Metjahic
Assistant Examiner—Etienne LeRoux
(74) Attorney, Agent, or Firm—Burns, Doane, Swecker & Mathis, LLP

(57) ABSTRACT

Direct-current voltage is applied to a capacitor and preliminary charge takes place, and then a measuring voltage is applied and insulation resistance is measured through a charging current flowing the capacitor. The period of the preliminary charge is set to be a period of charging capacitance of a capacitor, and during a period from the end of the preliminary charge to the application of the measuring voltage which is set to be a period in an open state during which the capacitor undergoes self-charging. During the self-charging period, the component of dielectric polarization of the capacitor is self-charged.

14 Claims, 12 Drawing Sheets

METHOD OF MEASURING INSULATION RESISTANCE OF CAPACITORS

Priority is claimed to Japanese Patent Application Nos. 10-174183, filed on Jun. 22, 1998, and 11-151198, filed on May 31, 1999, herein incorporated by reference.

BACKGROUND OF THE INVENTION

1. Field of the Invention

The present invention relates to a method of measuring insulation resistance of capacitors to be used in judgment of conformance and nonconformance of capacitors, etc.

2. Description of the Related Art

In order to judge conformance and nonconformance of capacitors to a standard, a method of measuring insulation resistance of capacitors is known. This known method measures current (charging current) flowing through a capacitor after a direct-current voltage for measurement is applied to the capacitor and the capacitor has been fully charged. As a matter of course, conforming capacitors have less charging current.

Up to now, among such methods of measuring insulation resistance, a measurement method defined in JIS-C 5102 is known. Because this method requires measurement of the current in the state that the capacitor has been fully charged, a measuring time of, e.g., about 60 seconds was required. However, an improvement of productive capacity and quality of electronic parts such as capacitors, etc. is required in accordance with the needs of cost reduction and reliability improvement of electronic equipment. As such, the conventional measurement method, in taking such a long measuring time per capacitor, is not able to fulfill such requirements.

In order to measure insulation resistance of chip capacitors efficiently, a turntable is used. In measurement methods of insulation resistance using a turntable, there is a continuous production that, after capacitors have been advanced past a plurality of preliminary charging stations, the insulation resistance of the charged capacitors is measured one at a time. There is also a batch production that, after a fixed number of capacitors have been fed on a turntable, the turntable is stopped and at the same time preliminary electrical charge is given to a plurality of capacitors, and their insulation resistance is measured thereafter.

FIGS. 1 and 2 are the drawings showing the fundamentals of the above-mentioned two measurement methods. Capacitors 1 are held on a conveying means 2 such as a turntable, etc. at intervals of a fixed space and transported in the direction of the arrow intermittently. FIG. 1 shows a continuous way of production. After a capacitor 1 has been fed at the feeding station $S_{IN}$, preliminary charge takes place at a plurality of preliminary charging stations of $S_{p1}$ To $S_{p4}$ every time the conveying means 2 stops, and then a measuring voltage E[v] is applied at the measurement station $S_M$ and the insulation resistance is measured by a measuring apparatus 3. After that, nonconforming capacitors are unloaded at the unloading station $S_{NG}$ for nonconforming articles and conforming capacitors are unloaded at the unloading station $S_G$ for conforming articles.

FIG. 2 shows a batch production. In the state that a plurality of capacitors 1 are held on a conveying means 2, the conveying means 2 is stopped for a fixed period of time, and a voltage which is the same voltage as the measuring voltage Em is applied at a plurality of measurement stations of $S_{M1}$ To $S_{M5}$ for preliminary charge and at the same time the insulation resistance is measured by measuring apparatuses 3. Further, reference numeral 4 represents a power supply of a rated voltage E[v], reference numeral 5 terminals for preliminary charge, and reference numeral 6 measurement terminals.

In the former case, because the electrodes of a capacitor are necessary to be made in contact with the terminals for preliminary charge many times, there is a disadvantage that the electrodes are likely to be damaged. Further, in the latter case, because preliminary charge is given to a number of capacitors 1 and they are measured at the same time, a large power supply unit is required. Furthermore, because multichannel measurements take place, many measuring apparatuses 3 are needed. Also, because one measuring apparatus 3 is switched for measurement, a complicated switching circuit is required. As a result, there was a drawback that the cost of equipment becomes high and the maintenance faces a difficulty.

SUMMARY OF THE INVENTION

Accordingly, it is an object of the present invention to present a method of measuring insulation resistance of capacitors in which the number of contact of terminals with a capacitor is able to be reduced and a circuit necessary for measurement is able to be simplified.

In order to attain the above-mentioned object, in a first aspect of the present invention, a method of measuring insulation resistance that the insulation resistance is measured through a charging current flowing through a capacitor when preliminary charge takes place by applying a charge voltage Ep to the capacitor and then a measuring voltage Em is applied is characterized in that self-charge takes place in an open state during the time from the finish of the above-mentioned preliminary charge to the application of the measuring voltage Em.

Here, the principle of a method of measuring insulation resistance according to the present invention is explained. An equivalent circuit of a capacitor such as a ceramic capacitor is composed of capacitance $C_0$, internal resistance r, insulation resistance $R_0$, and the component of dielectric polarization (component of electrostatic absorption) D as shown in FIG. 3. When a direct-current voltage is applied to such a capacitor, its charging characteristic is as shown in FIG. 4. That is, the initial nonlinear charging characteristic A represents a region of charging capacitance $C_0$. The linear charging characteristic C represents a region of charging the component of dielectric polarization D. The characteristic B represents a transition region between them. In FIG. 4, the vertical axis (current) and horizontal axis (time) are of a log scale.

Now, in FIG. 4, the charge is stopped in the course of the linear charging characteristic C and the capacitor is left in an open state, that is, without voltage applied. Then, after a fixed period of time, the charge is restarted. At this time, it has been found that, as shown by a broken line in FIG. 4, although the charging current value goes high once, the value is immediately stabilized on the linear charging characteristic C. After discussion of the phenomenon, the following reasoning was thought about by the present inventors. When charging is started initially, capacitance $C_0$ of a capacitor is charged by a charging voltage. But because it takes time to charge the component of dielectric polarization D, the component D is little charged at the initial step. While the charge is stopped, there is no flow of electric current to or from the outside because the capacitor is in an open state, that is, without voltage applied. During this time, charge (self-charge) of the component of dielectric polarization D by the electric charge in capacitance $C_0$ takes place, and this charge is in progress as if the first electric charge was not interrupted. Further, as capacitance $C_0$ is larger in capacitance than the component of dielectric polarization D, the charging voltage is lowered a little. When the charge is started again, because the charge of the component of dielectric polarization D has already progressed, it is thought that a little charge makes the capacitor stabilized in the desired charging characteristic C.

So, according to the present invention, by self-charge in an open state, that is, without voltage applied during the time from the finish of preliminary charge to the application of a measuring voltage, a capacitor is able to be charged without the electrodes of the capacitor making contact with the terminals many times for the purpose of preliminary charging. Furthermore, when a measuring voltage is applied to the capacitor, the self-charge of which has finished, it is possible to measure normal insulation resistance in a short period of time. Therefore, multiple measuring apparatuses and complicated switching circuit are not required.

As in a third aspect of the present invention, a period $T_1$ for preliminary charge is desirable to be set to be more than time Tb of a charging time A of capacitance $C_0$ plus a transition time B. In this way, capacitance $C_0$ is fully charged. Time Tb is not fixed, and if the preliminary charge voltage Ep is set higher than the measuring voltage Em, the time Tb is able to be reduced. Further, preliminary charge is not limited to one time, and a plurality of preliminary charges is allowed. When preliminary charge of two times takes place, the first and second preliminary charge may be well set to be more than Tb/2 respectively.

As in a fourth aspect of the present invention, an open period $T_2$ for self-charge is desirable to set to be more than time Tc which is needed to reach a charging current value $A_1$ when a rated voltage is applied to the insulation resistance R of a capacitor. In other words, this is to secure the time for the component of dielectric polarization D to be fully self-charged.

As in a fifth aspect of the present invention, a first preliminary charge may be performed at the same voltage as the measuring voltage Em, a secondary preliminary charge may be performed at the same voltage as the measuring voltage Em after a predetermined open period, and the measuring may be performed afterwards. During the open period, a voltage e applied to both ends of the capacitor decreases a little because of the consumption by the insulation resistance Ro or the charge to the dielectric polarization component D. The longer the open period is, the more the voltage decreases. When the measuring voltage Em is applied later, re-charge to the capacitance Co because of the decreased voltage, thereby making it longer to reach to the predetermined charging time A. Thus, in the secondary preliminary charge, the voltage Ep which is the same as the measuring voltage Em is applied thereby reducing the voltage decrease, which shortens the measuring time. Preferably, the secondary preliminary charge is applied just before the charge of the measuring voltage Em.

Further, the secondary preliminary charge also has an effect as to be explained in the following. That is, during the open period the component of dielectric polarization of a capacitor is charged by a voltage e [v] between the terminals of the capacitor. However, because the voltage e [v] gradually diminishes in accordance with the lapse of the open period, e [v] becomes smaller than Em [v]. When a measuring voltage Em [v] is applied, the time required to charge the component of dielectric polarization for the second time is far longer than to charge capacitance $C_0$. For example, in the case of a ceramic capacitor of 1 $\mu$F, capacitance $C_0$ takes a few milliseconds as charging time, but the charging time of the component of dielectric polarization D is a few hundreds milliseconds. In order to reduce this voltage drop Em–e [v], the secondary preliminary charge takes place. The secondary preliminary charge in this case may be subjected to after a time of $\sqrt{(Tc)}$ has lapsed from the first preliminary charge. The reason is that a voltage drop after the first preliminary charge is made equal to a voltage drop after the secondary preliminary charge and the charge of the component of dielectric polarization D to a voltage different from the measuring voltage Em [v] is prevented.

As in a sixth aspect of the present invention, it is preferably that the charge voltage Ep of the preliminary charge is set higher than the measuring voltage Em, and the charge voltage Ep is set so that the voltage e of both ends of the capacitor decreases equal to or less than the measuring voltage Em in the open period. Namely, as described above, during the open period the voltage e applied to the both ends of the capacitor decreases a little because of the consumption by the insulation resistance Ro or the charge to the dielectric polarization component D. Since the standard voltage which is similar to the measuring voltage Em is applied in the preliminary charge, when the open period gets longer, it takes time for the charged current to gather because of the voltage decrease of the voltage e at measuring thereby causing the delay in measuring the leaked current. Thus, by setting the charge voltage Ep higher than the measuring voltage Em, the voltage decrease of the voltage e is suppressed and the leaked current can be measured in a short period by gathering the charge current quickly when measuring.

However, when the preliminary charge voltage Ep is set too high, the reverse current may flow when measuring since the voltage e applied to the both ends of the capacitor is higher than the measuring voltage Em. Namely, insulation resistance is measured higher than in actual, thereby being misjudged that it is a good product, although it is a bad product. So, in the present invention, the reverse current is prevented from flowing by setting the charge voltage Ep so that the voltage e applied to the both ends of the capacitor decreases equal to or less than the measuring voltage Em in the open period.

As in a seventh embodiment of the present invention, the charge voltage Ep of the preliminary charge may be set higher than the measuring voltage Em, and the secondary preliminary charge may be performed at the same voltage as the measuring voltage just before the measuring in the predetermined open period. Namely, when the high voltage preliminary charge is performed as in the sixth embodiment, the reverse current may flow when applying charge because there is such a case that the voltage decrease in an open period is small and the voltage applied to both ends is higher than the measuring voltage when measuring. Thus, the flow reverse current when measuring can be prevented by performing the secondary preliminary charge at the same voltage as the measuring voltage Em just before measuring and by correcting the voltage e of both ends of the capacitor to the measuring voltage Em.

As in an eighth aspect of the present invention, the first preliminary charge may be performed at the voltage $E_{p1}$ which is higher than the measuring voltage Em, the secondary preliminary charge may be performed at the voltage $E_{p2}$ which is lower than the voltage $E_{p1}$ and higher than the measuring voltage Em after a predetermined open period, and the measuring may be performed after a further predetermined open period.

In this case, since two times of preliminary charge are performed at the voltage Ep1 and Ep2 which are higher than the measuring voltage Em, although the open period is short, the charge to the dielectric polarization component D can be proceeded fully.

Preferably, since the reverse current is prevented, the secondary preliminary charge voltage may be set so that the voltage e applied to both ends of the capacitor decreases equal to or less than the measuring voltage Em during the open period.

When a high voltage preliminary charge is performed as in the seventh and eighth embodiments, as in a ninth embodiment, an electric discharge can be performed just after the high voltage preliminary charge. Namely, when the high voltage preliminary charge is performed longer than necessary, the charge voltage becomes too high and the reverse current flows. In such a case, when measuring is performed, a characteristic of a good product is shown although it is a bad product. Therefore, it can be prevented that the charge voltage becomes too high by performing electric discharge after the high voltage preliminary charge.

BRIEF DESCRIPTION OF THE DRAWINGS

The present invention will be described with reference to exemplary embodiments, to which it is not limited, and illustrated in the accompanying drawings.

DESCRIPTION OF THE PREFERRED EMBODIMENT

Figure 5:
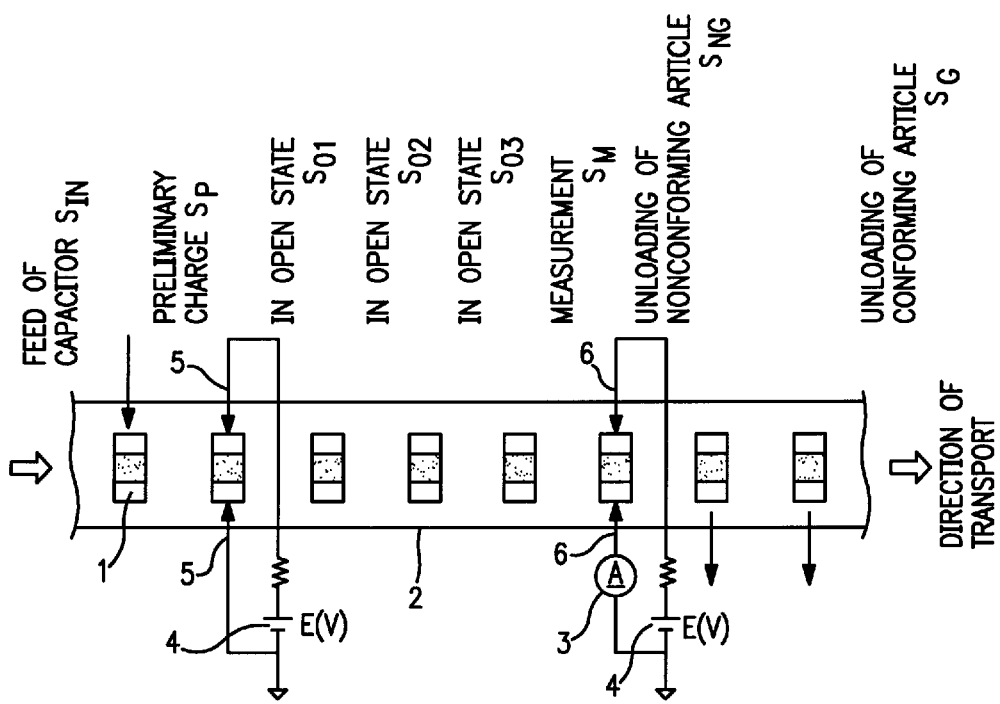
FIG. 5 is an explanatory diagram of a first embodiment of a method of measuring insulation resistance according to the present invention.

FIG. 5 shows a first embodiment of an apparatus of measuring insulation resistance to realize a method of the present invention. In the drawing, reference numeral 1 represents a capacitor and reference numeral 2 a conveying means. Here, the conveying means is illustrated as a belt-like member, but any conveying means such as a turntable, an endless belt, a conveying pallet, etc. may be used. Further, although a capacitor 1 is held at a fixed position on the conveying means 2 and conveyed, the holding method may be a concave portion given on the conveying means 2 or a suction and holding by air suction, etc. Furthermore, either of an intermittent driving and a continuous driving may be used as the driving form of the conveying means 2.

After a capacitor 1 was fed at the feed station $S_{IN}$, the conveying means is stopped at the next preliminary charge station $S_p$ and preliminary charge takes place by the electrodes of the capacitor 1 made in contact with preliminary charge terminals 5. Here, the same rated voltage as the measuring voltage Em [v] is applied as a preliminary charge to the capacitor 1 and internal capacitance $C_0$ of the capacitor is charged. The period $T_1$ for preliminary charge is set to be more than time Tb which is a sum of a charging time A of capacitance $C_0$ and a transition time B of capacitance $C_0$, and $T_1 \geq Tb$.

After preliminary charge has been finished, a capacitor 1 is sent past a plurality of open stations of $S_{O1}$ to $S_{O3}$. Here, as the capacitor 1 is kept in an open state, there is no current to or from the outside. During this period, charge (self-charge) of the component of dielectric polarization D takes place by an electric charge charged in capacitance $C_0$. The open period $T_2$ for this self-charge is set to be more than time Tc needed to reach a charge current value $A_1$ (=$E_0/R_0$) flowing when a rated voltage is applied to the insulation resistance of the capacitor. That is, $T_2 \geq Tc$.

When the capacitor 1 arrives at the measurement station $S_M$, measuring terminals 6 are made to contact the electrodes of the capacitor 1 and the insulation resistance is measured by a measuring apparatus 3 while the capacitor is charged under a measuring voltage Em [v]. At this time, as not only capacitance $C_0$, but also the component of dielectric polarization D are fully charged, it is not required that the measuring terminals 6 are made in contact with the electrodes of the capacitor 1 for a long time, and therefore a short measuring time suffices. After that, any nonconforming capacitor is unloaded at the nonconforming article unloading station $S_{NG}$, and conforming capacitors are unloaded at the conforming article unloading station $S_G$.

Figure 5A:
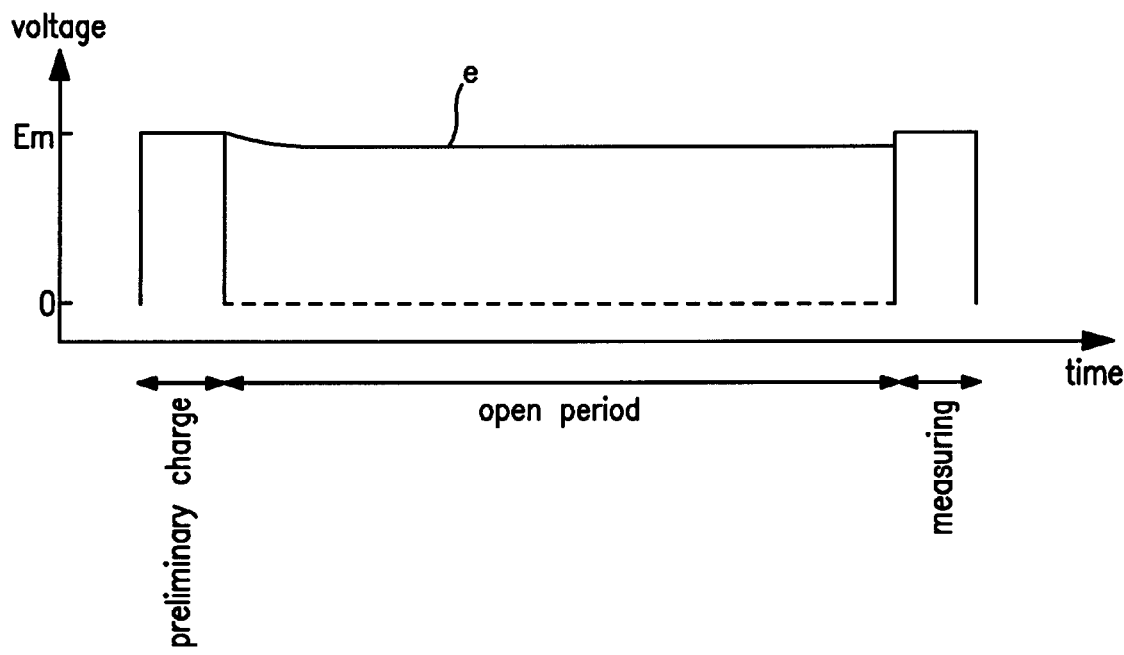
FIG. 5A is a view showing the voltage of both ends of the capacitor related to a time change in accordance with the insulation resistance measuring method of FIG. 5.

FIG. 5A is a view showing the voltage e of both ends of the capacitor 1 related to a time change in accordance with the insulation resistance measuring device of FIG. 5.

After the voltage Ep(=Em) as a preliminary charge is applied, the voltage e of both ends of the capacitor 1 is decreased gradually during the open period because of the consumption by the insulation resistance $R_0$ or the charge to the dielectric polarization component D. When the open period terminates, the voltage e decreases to a little less than the measuring voltage Em.

Since the self charge is proceeded during the open period and the dielectric polarization component D is charged fully, the measuring time can be shortened because it is not necessary that the measuring terminal 6 is contacted to the terminals of the capacitor in the measuring station Sm for a long time.

Figure 1:
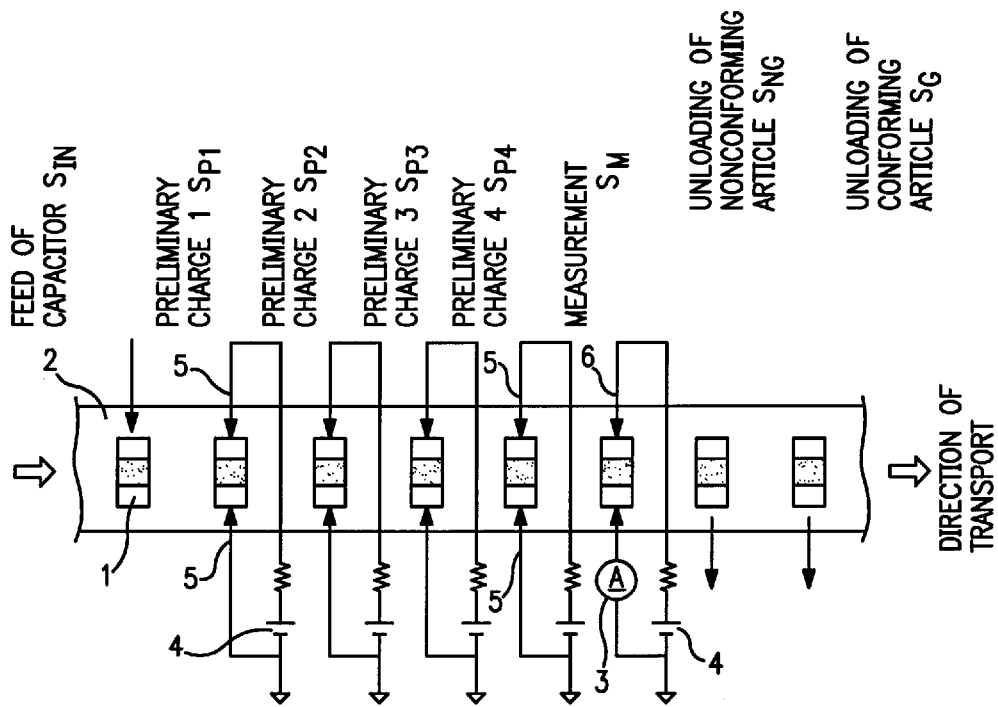
FIG. 1 is an explanatory diagram of one example of a conventional method of measuring insulation resistance.
Figure 2:
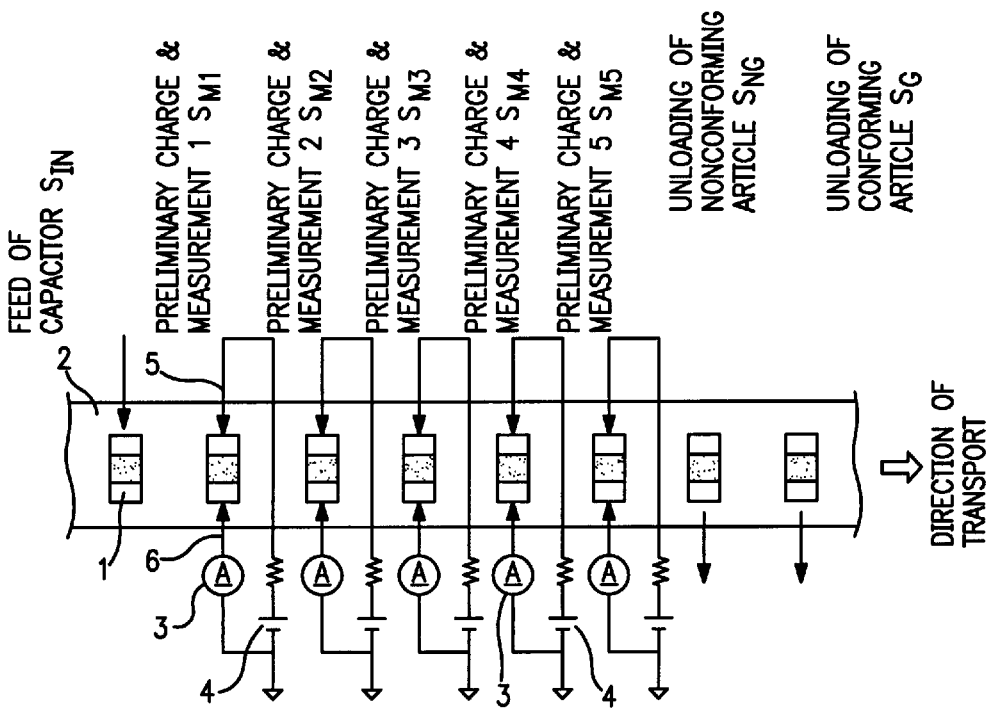
FIG. 2 is an explanatory diagram of another example of a conventional method of measuring insulation resistance.
Figure 3:
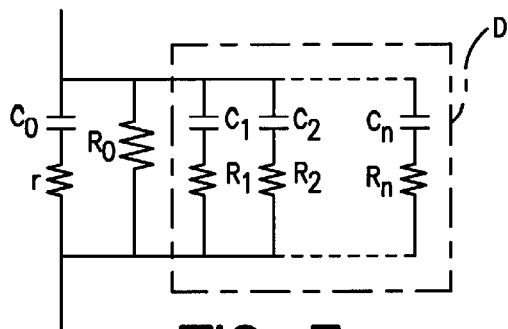
FIG. 3 is an equivalent diagram of a capacitor.
Figure 4:
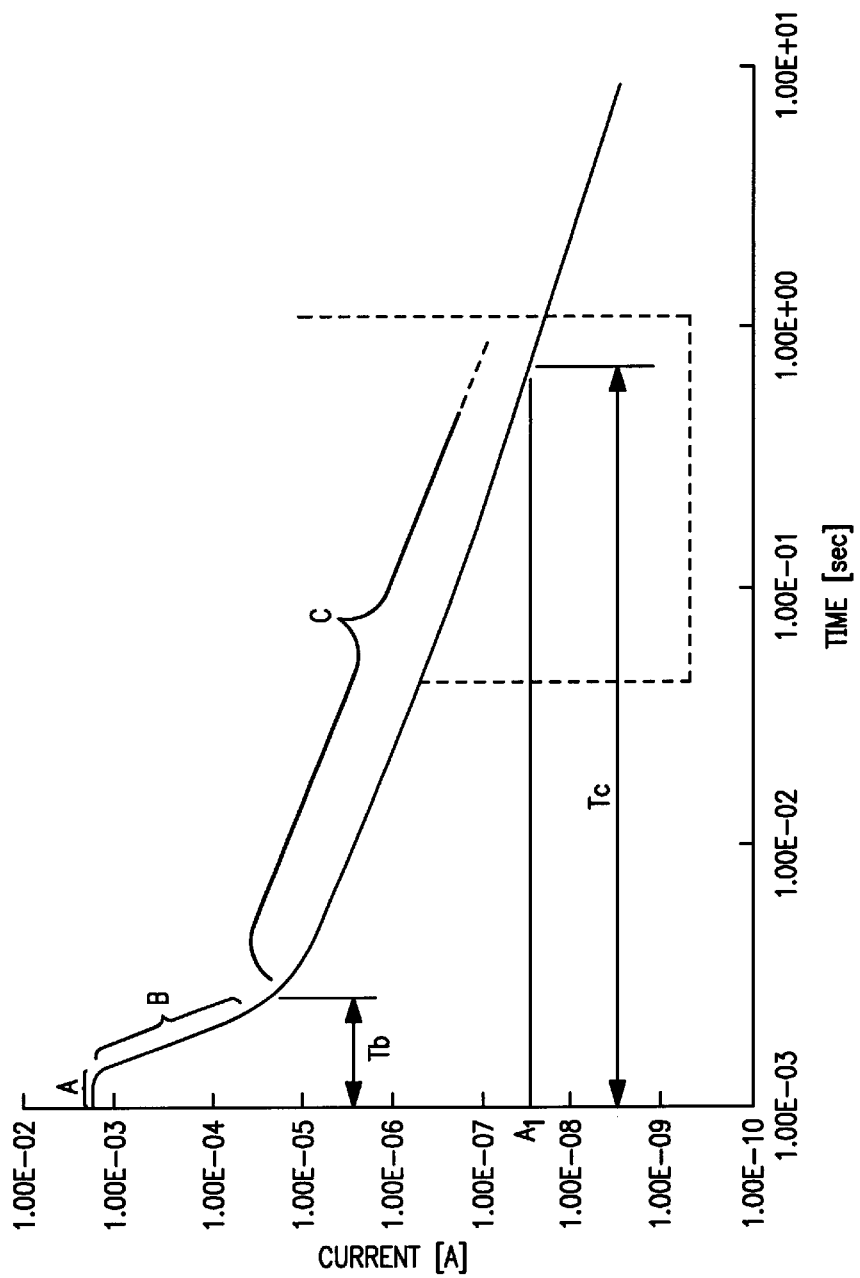
FIG. 4 is a diagram of charge characteristic of a capacitor.

Next table shows the comparison of a device between a measuring method according to the present invention shown in FIG. 5 and conventional measuring methods shown in FIGS. 1 and 2.

TABLE 1

| | Number of terminals | Preliminary charge circuit | Charge & measurement circuit | Number of times of terminal made in contact | Cost of equipment |
|---|---|---|---|---|---|
| Present invention | 2 | 1 | 1 | 2 | Low |
| Conventional technology (1) | 10 | 9 | 1 | 10 | Moderate |
| Conventional technology (2) | 5 | 0 | 5 | 1 | High |

As clearly seen in Table 1, according to the present invention the number of terminals and the number of times of terminal made in contact are remarkably reduced compared with a conventional technology (1) (FIG. 1), and the number of preliminary charge circuits is also able to be reduced. Further, even if compared with a conventional technology (2) (FIG. 2), although the number of preliminary charge circuits and the number of times of terminal made in contact are slightly increased, the terminals and measuring circuits are able to be reduced. As a result, it is understood that the effect of reduction of equipment cost is great. Further, in FIG. 1 the number of preliminary charge is set to be four times and in FIG. 2 the number of measuring circuits is set to be five, but they are actually much more than these and the effect of the present invention is more remarkable.

Figure 6:
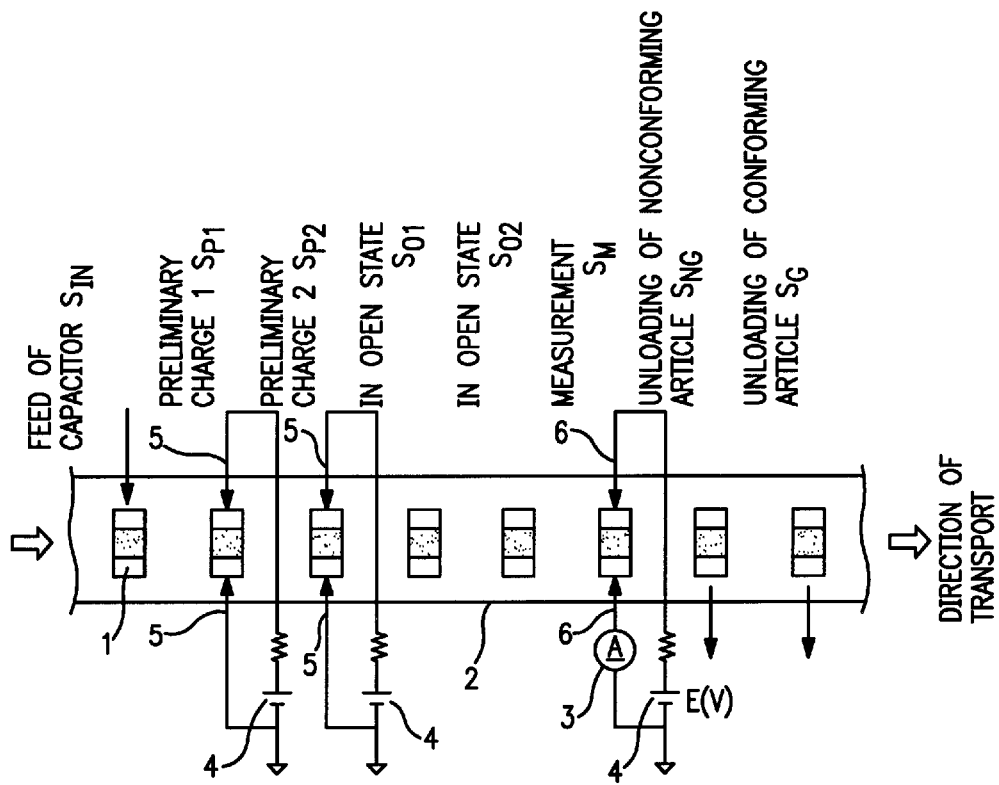
FIG. 6 is an explanatory diagram of a second embodiment of a method of measuring insulation resistance according to the present invention.

FIG. 6 shows a second embodiment of an apparatus of measuring insulation resistance to realize a method of the present invention. In this embodiment, preliminary charge takes place twice at $S_{p1}$ and $S_{p2}$. As the preliminary charge period is set to be more than Tb/2 each time, the total preliminary charge period $T_1$ is made more than Tb. In this case, if preliminary charge of one capacitor is assumed to take Tb/2, a processing time per capacitor is given by time Tb/2 plus a time consumed by the equipment (time needed for the rise and fall of terminals and conveying), and the processing speed is able to be improved compared with in FIG. 5. For example, if Tb is assumed to be 60 ms and a time consumed by the equipment Ta to be 60 ms, in the case of the embodiment in FIG. 5 the processing time per capacitor becomes 120 ms (60 ms+60 ms), but in FIG. 6 the processing time per capacitor becomes 90 ms (30 ms+60 ms), that is, the processing speed is improved about 30%.

Figure 6A:
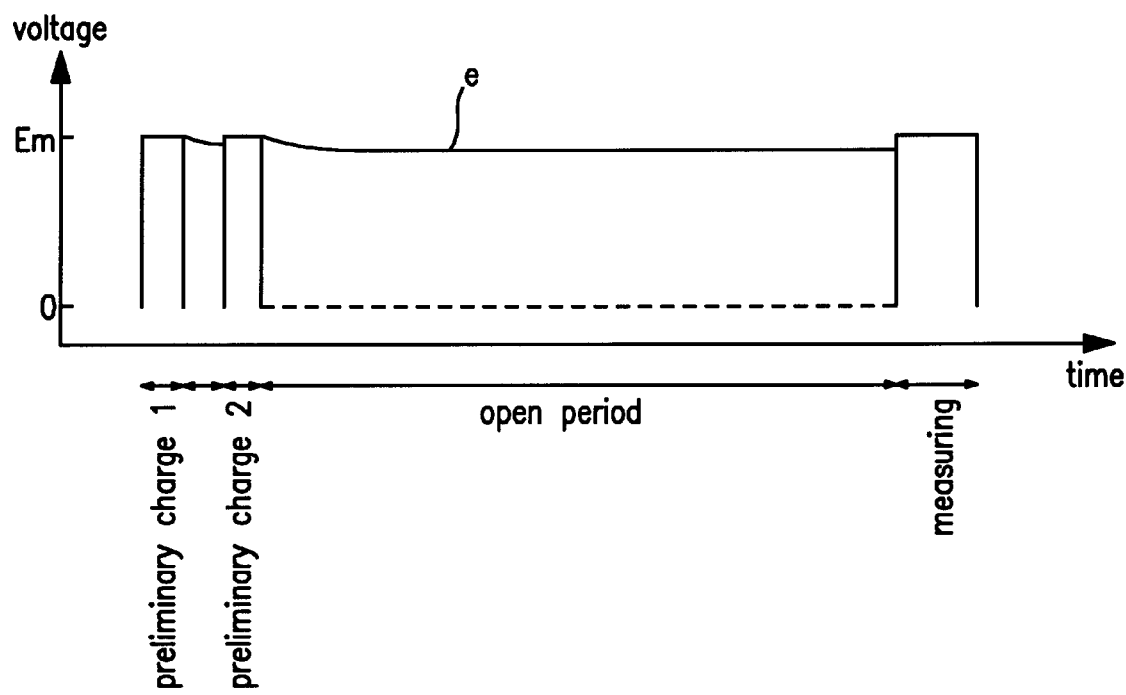
FIG. 6A is a view showing the voltage of both ends of the capacitor related to a time change in accordance with the insulation resistance measuring method of FIG. 6.

FIG. 6A is a view showing the voltage e of both ends of a capacitor 1 related to a time change in accordance with the insulation resistance measuring device of FIG. 6.

After the two of preliminary charges $S_{p1}$ and $S_{p2}$ are performed, the voltage e shows the same change as in FIG. 5A, thereby attaining the similar advantage of the embodiment of FIG. 5.

Figure 7:
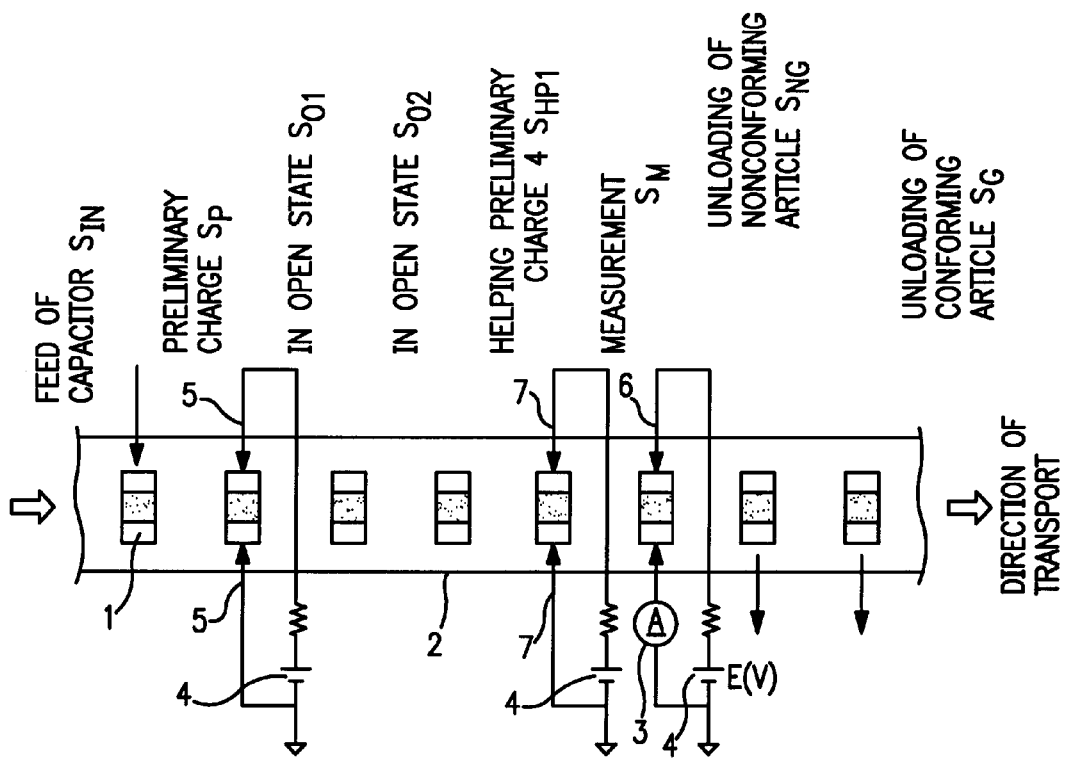
FIG. 7 is an explanatory diagram of a third embodiment of a method of measuring insulation resistance according to the present invention.

FIG. 7 shows a third embodiment of an apparatus of measuring insulation resistance to realize a method of the present invention. In this embodiment a helping preliminary charge station $SP_2$ is given just before the measurement station $S_M$. As during an open period (a period in an open state) a voltage e [v] between the electrodes of a capacitor 1 is slightly lowered because of dissipation by insulation resistance $R_0$ and charge of the component of dielectric polarization D, the voltage e of both ends of a capacitor 1 can be made substantially the same as the measuring voltage by applying the voltage Ep which is the same as the measuring voltage Em in the secondary preliminary charge station $Sp_2$. Because of this, when the measuring voltage Em [v] is applied at the measurement station $S_M$, another charge of capacitance $C_0$ instantly takes place, and the time for arriving at a fixed threshold value A1 is able to be made less. Further, reference numerals 5 and 7 represent the terminals for helping preliminary charge.

Figure 7A:
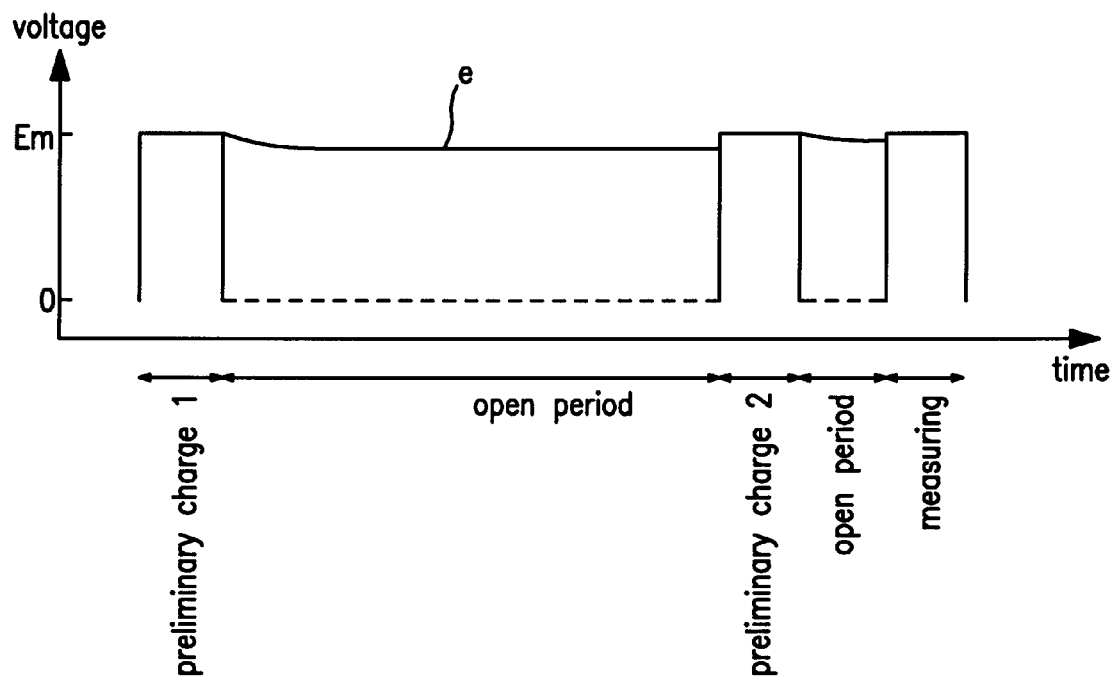
FIG. 7A is a view showing the voltage of both ends of the capacitor related to a time change in accordance with the insulation resistance measuring method of FIG. 7.

FIG. 7A is a view showing the voltage e of both ends of a capacitor 1 related to a time change in accordance with the insulation resistance measuring device of FIG. 7. By performing the secondary preliminary charge at the voltage Em just before measuring, the difference between the voltage e of the capacitor 1 and the measuring voltage Em becomes very small, thereby reducing the measuring time further.

Figure 8:
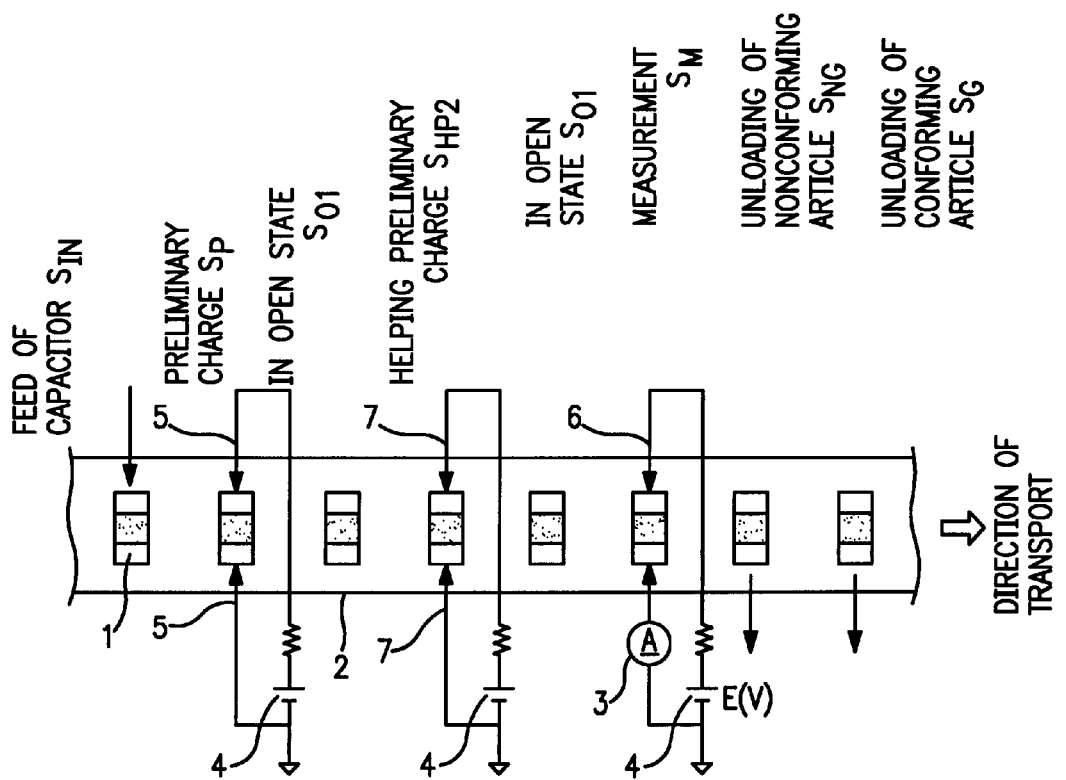
FIG. 8 is an explanatory diagram of a fourth embodiment of a method of measuring insulation resistance according to the present invention.

FIG. 8 shows a fourth embodiment of an apparatus of measuring insulation resistance to realize a method of the present invention. In this embodiment, in the middle of the first preliminary charge station $SP_1$ and measurement station $S_M$ a secondary preliminary charge station $SP_2$ is given. In a concrete way, the secondary preliminary charge takes place in a time of √(Tc) after the first preliminary charge.

This is to charge a capacitor 1 by the secondary preliminary charge to the measuring voltage Em [v] again and to prevent the component of dielectric polarization D from being charged to a voltage different from the measuring voltage because during an open period (a period in an open state) the voltage e [v] between the electrodes of the capacitor 1 is slightly lowered.

Figure 8A:
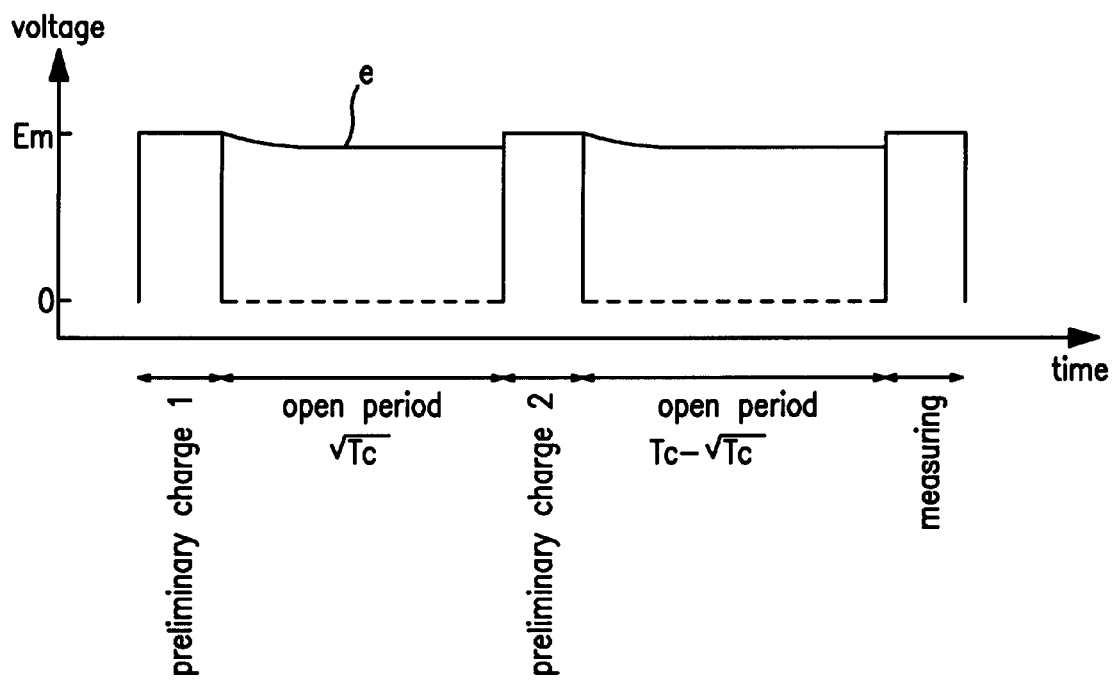
FIG. 8A is a view showing the voltage of both ends of the capacitor related to a time change in accordance with the insulation resistance measuring method of FIG. 8.

FIG. 8A is a view showing the voltage e of both ends of a capacitor 1 related to a time change in accordance with the insulation resistance measuring device of FIG. 8.

By performing the secondary preliminary charge after √(Tc) has passed from the first preliminary charge, the voltage decrease in the first charge becomes the same as the voltage decrease after the secondary charge. Therefore, it can be prevented that the dielectric polarization component D is charged to a voltage which is different from the measuring voltage Em.

Figure 9:
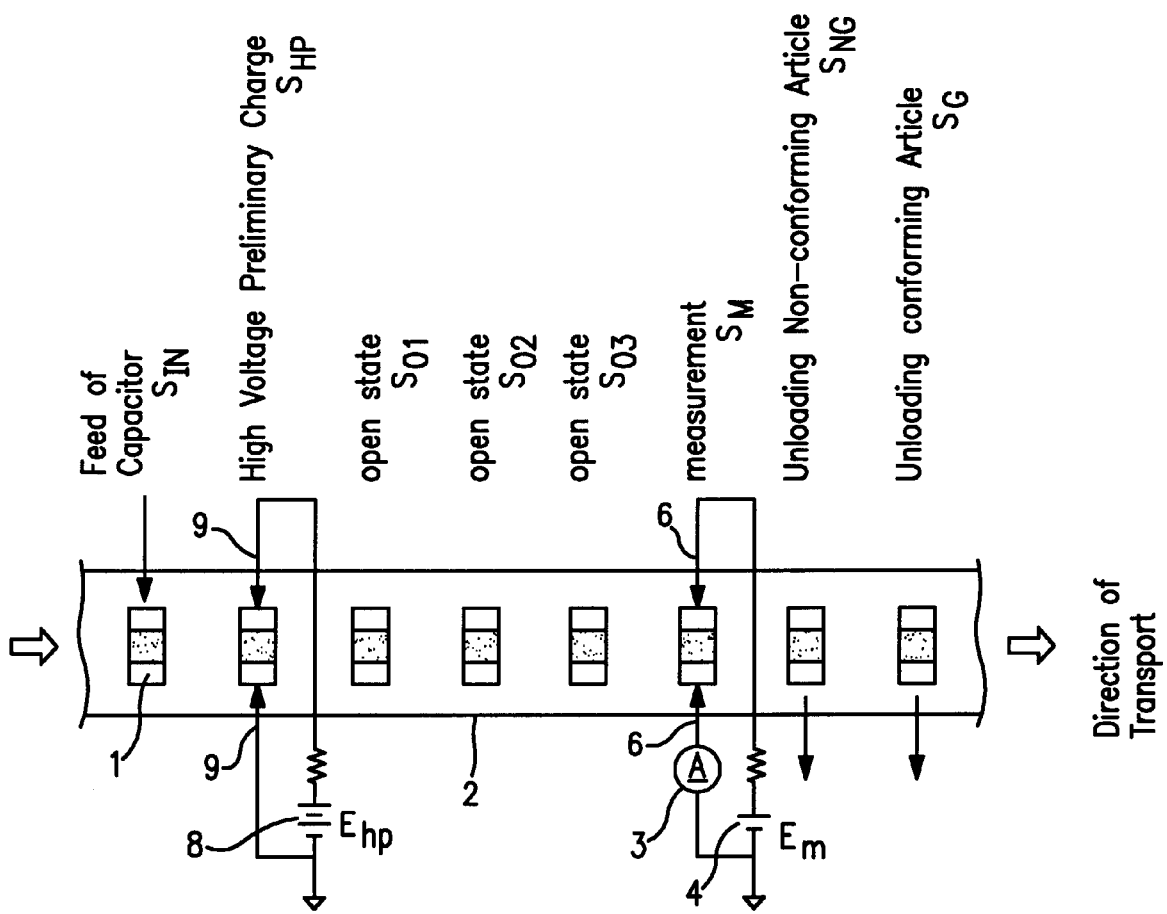
FIG. 9 is an explanatory diagram of a fifth embodiment of a method of measuring insulation resistance according to the present invention.

FIG. 9 shows a fifth embodiment of the insulation resistance measuring method of the present invention. In this embodiment, a high voltage preliminary charge station $S_{HP}$ is provided as a preliminary charge station. In this high voltage preliminary charge station $S_{HP}$, a direct current voltage Ehp which is higher than the measuring voltage Em (rated voltage) and the charge voltage Ehp is set so that the voltage e of the both ends of a capacitor 1 decreases equal to or less than the measuring voltage Em during the open period. For example, when the open period is 20 seconds, Ehp/Em is set to 1.05 to 1.15, for example. Numeral 8 is a power of the high voltage preliminary charge station and numeral 9 is a terminal for high voltage preliminary charge.

Figure 9A:
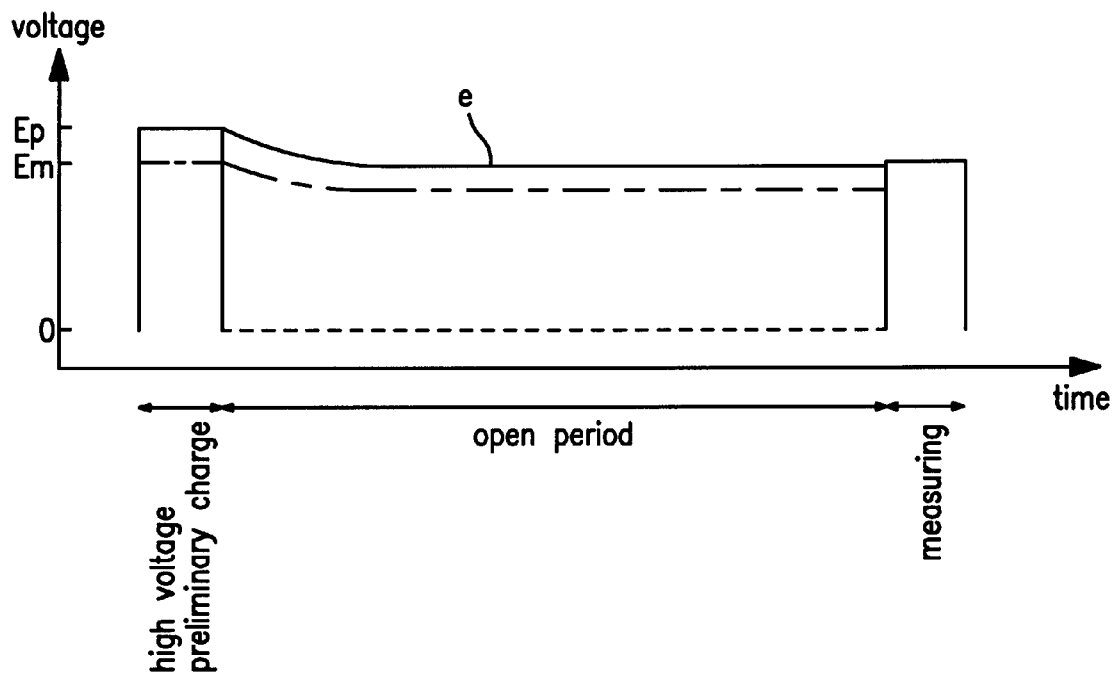
FIG. 9A is a view showing the voltage of both ends of the capacitor related to a time change in accordance with the insulation resistance measuring method of FIG. 9.

FIG. 9A is a view showing the voltage e of both ends of a capacitor 1 related to a time change in accordance with the insulation resistance measuring device of FIG. 9.

A broken line in FIG. 9A shows the voltage e related to time change when the standard voltage which is the same as the measuring voltage Em is applied as a preliminary charge. In this case, when the open period becomes longer, the voltage decrease of the voltage e becomes larger, thereby taking longer time to measure because the difference between the voltage e and the measuring voltage Em at measuring is large. On the other hand, when the high voltage preliminary charge is performed as in the fifth embodiment, as shown in the solid line in FIG. 9A, the leaked current can be measured in a shorter time. For the difference between the voltage e and the measuring voltage Em is small and the charged currents are gathered when the measuring voltage Em is applied.

Further, although the voltage Ehp of the high voltage preliminary charge is higher than the measuring voltage Em, the voltage e applied both ends of a capacitor is not thereby preventing the reverse current from flowing. Therefore, misjudging bad products as good products can be prevented.

Figure 10A:
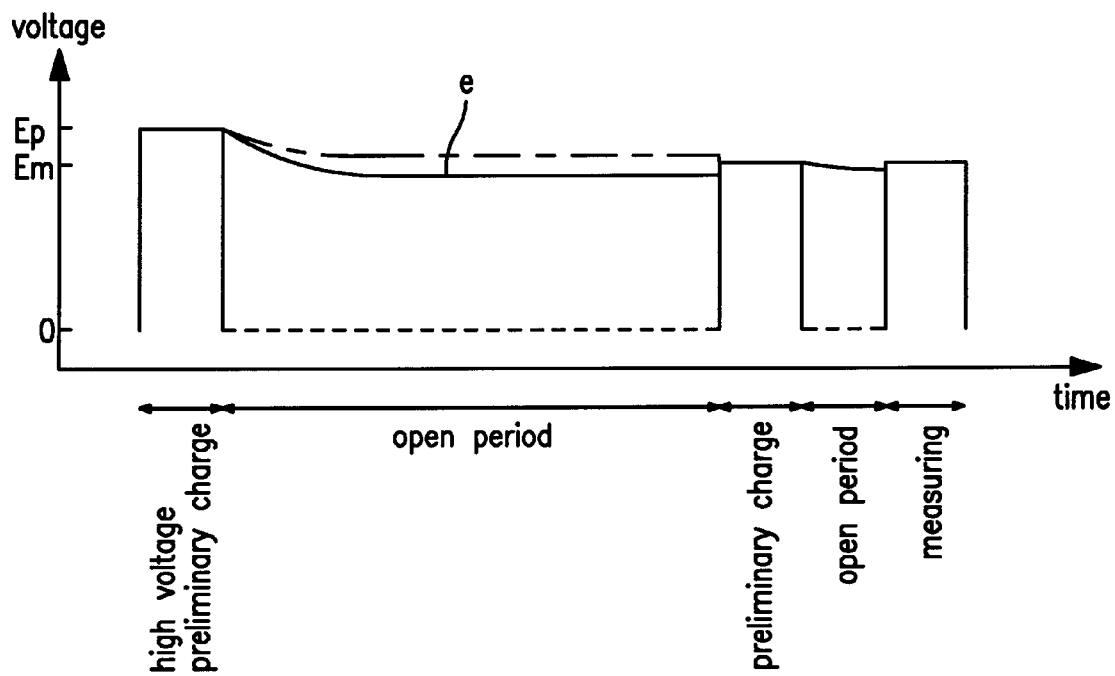
FIG. 10A is a view showing the voltage of both ends of a capacitor related to a time change in accordance with the insulation resistance measuring method of FIG. 10.
Figure 10:
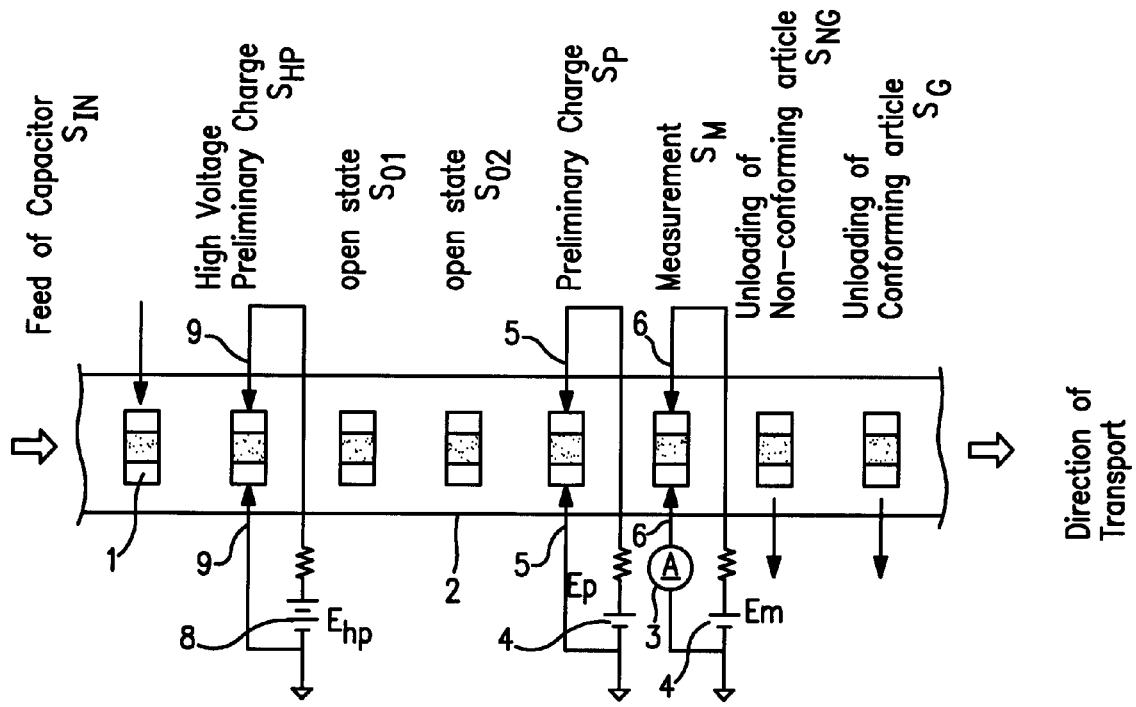
FIG. 10 is an explanatory view of a sixth embodiment of a method of measuring insulation resistance according to the present invention.

FIG. 10 shows a sixth embodiment of the insulation resistance measuring device of the present invention.

In this embodiment, as in the fifth embodiment, a high voltage preliminary charge station $S_{HP}$ for charging by the voltage Ehp which is higher than the measuring voltage Em is provided, and a preliminary charge station Sp for charging by the voltage Ep which is the same voltage as the measuring voltage Em before measuring is further provided. In this case, the charge voltage Ehp needs not to be set so that the voltage e applied both ends of a capacitor decreases equal to or less than the measuring voltage Em during the open period. The charge voltage Ehp may be set higher than it.

FIG. 10A shows the voltage e applied both ends of a capacitor related to a time change according to the insulation resistance measuring device of the present invention shown in FIG. 10.

In this case, by performing a high voltage preliminary charge, self charge can be performed in a shorter period. And although the period between the preliminary charge Sp and the measurement SM, a charge to a dielectric polarization component can be performed fully. Further, if a normal capacitor is used, the characteristics of the solid line is shown. However, there are some capacitors whose characteristic is like a broken line where the voltage decrease of the voltage e is small. As a result, a reverse current may flow when measuring by the measuring method of FIG. 9A. According to the insulation resistance measuring method of FIG. 10, since the preliminary charge is performed at the standard voltage Em before measuring, the voltage e of the capacitor can be corrected to the standard voltage in the secondary preliminary charge, thereby preventing the reverse current securely from flowing when measuring.

Figure 11:
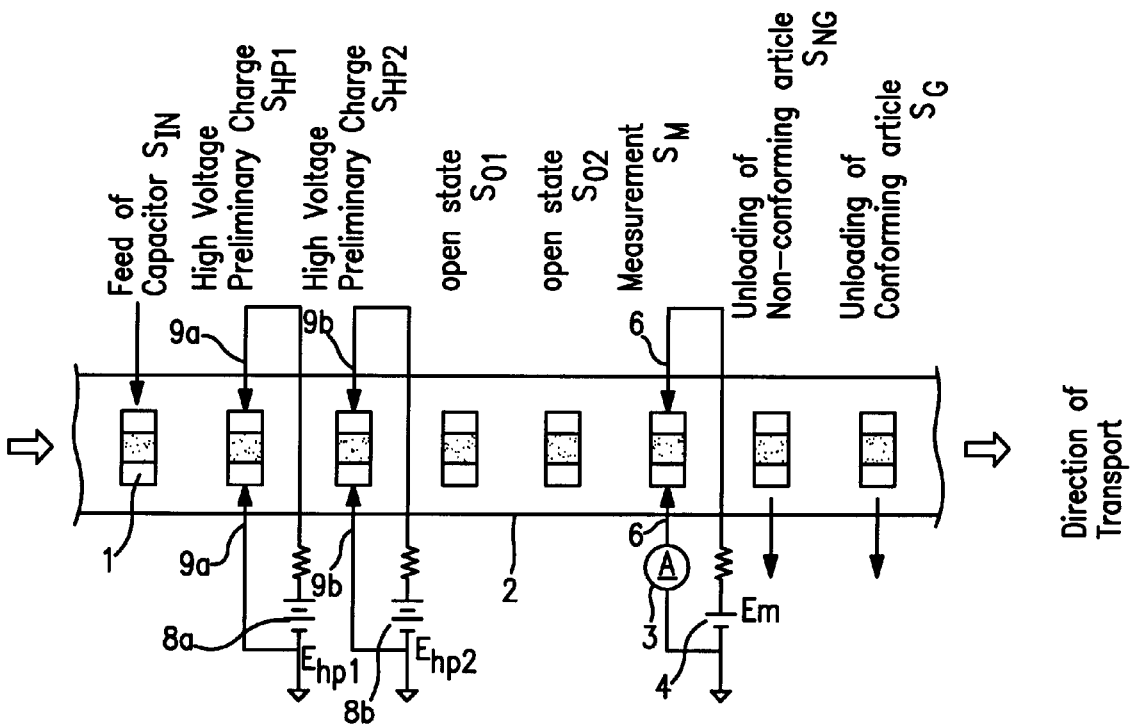
FIG. 11 is an explanatory view of a seventh embodiment of a method of measuring insulation resistance according to the present invention.

FIG. 11 shows a seventh embodiment of the insulation resistance measuring device according to the present invention. In this embodiment, a high voltage preliminary charge station $S_{HP1}$ by the voltage $E_{hp1}$ which is higher than the voltage $E_{hp2}$ is provided before a high voltage preliminary charge station $S_{ph2}$ by the voltage $E_{hp2}$ which is higher than the standard voltage is provided. Numerals 8a and 8b are powers of the high voltage preliminary charge stations and numerals 9a and 9b are high voltage preliminary charge terminals.

Figure 11A:
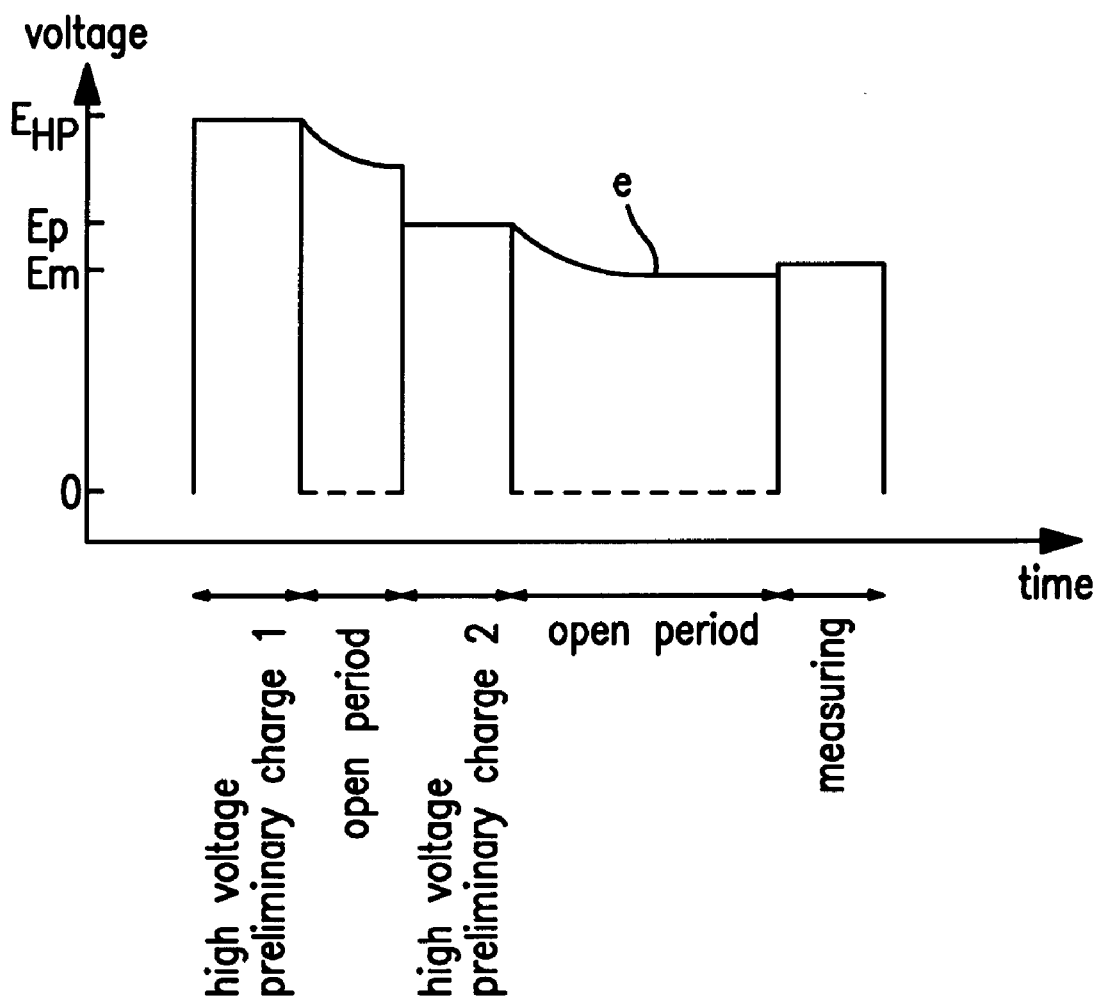
FIG. 11A is a view showing the voltage of both ends of a capacitor related to a time change in accordance with the insulation resistance measuring method of FIG. 11.

FIG. 11A shows the voltage e of both ends of the capacitor related to a time change according to the insulation resistance measuring method of FIG. 11.

In this case, the self charge can be performed in a shorter period by the first high voltage preliminary charge $S_{HP1}$. Further, although the open period from the secondary high voltage preliminary charge $S_{HP2}$ to the measuring $S_M$ is short, a charge to the dielectric polarization component can be done fully, thereby reducing the whole period of charging and measuring. In detail, the open period of the first charge can be shortened to 0.1 to 0.2 seconds, and the open period of the secondary charge can be shortened to 0.5 seconds.

It is preferable that the charge voltage $E_{hp2}$ of the secondary high voltage preliminary charge is set so that the voltage e applied to both ends of a capacitor decreases equal to or less than the measuring voltage Em during the open period.

Figure 12:
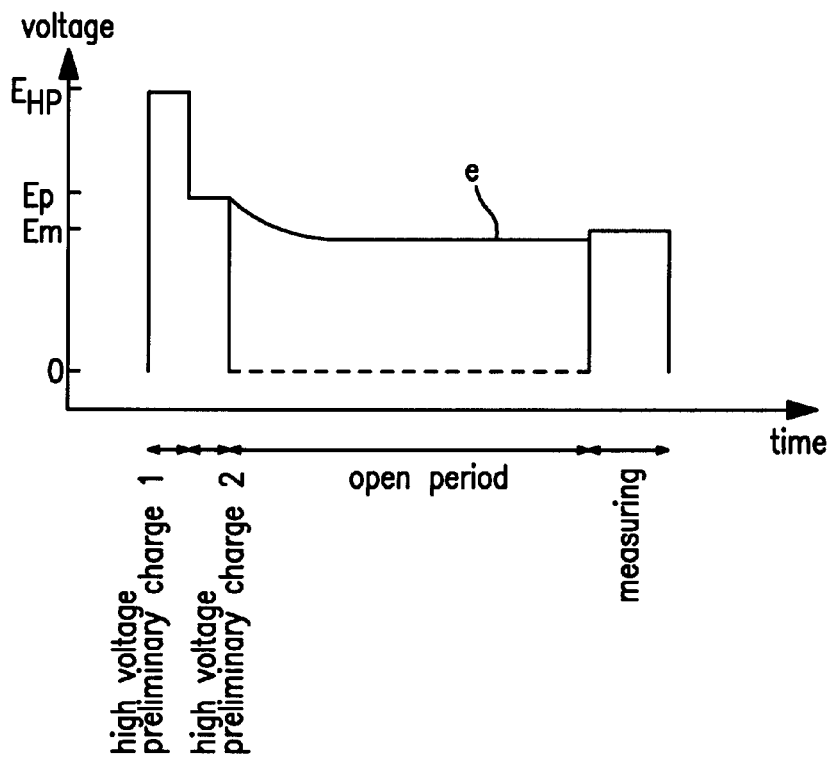
FIG. 12 is a view showing the voltage of both ends of a capacitor related to a time change in accordance with the eighth embodiment of the present invention.

A method of preliminary charge according to the present invention is not limited to the above embodiments, and various modifications are possible as follows:

FIG. 12 is a modified embodiment of the insulation resistance measuring method of FIG. 9 and FIG. 9A. In this embodiment, there are provided two steps of high voltage preliminary charge, namely, a first high voltage preliminary charge by the voltage Ehp and a secondary high voltage preliminary charge by the voltage Ep which is lower than the voltage Ehp but higher than the voltage Em. Here, when the voltage Ehp is set to 2.5 times of the measuring voltage Em and the voltage Ep is set to 1.05 to 1.15 times of the measuring voltage Em, the open period can be shortened to 2 to 3 seconds, thereby attaining a preferable advantage. The sum of the period of high voltage preliminary charge by the voltage Ehp and the period of high voltage preliminary charge by the voltage Ep may be 5 to 200 milliseconds.

Figure 13:
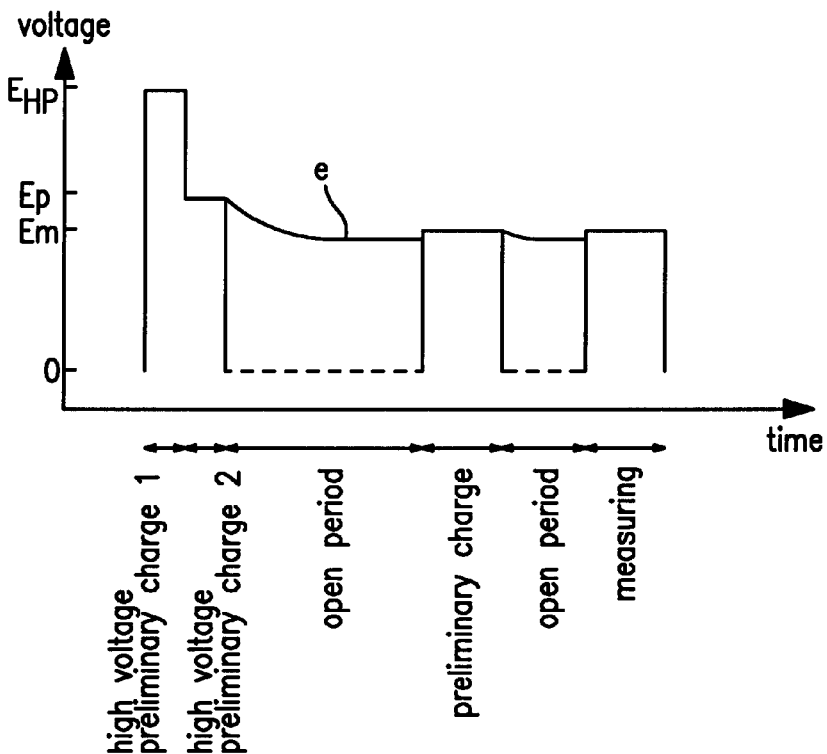
FIG. 13 is a view showing the voltage of both ends of a capacitor related to a time change in accordance with the ninth embodiment of the present invention.

FIG. 13 shows a modified embodiment of the insulation resistance measuring method of FIG. 10 and FIG. 10A. In this embodiment, there are provided two steps of high voltage preliminary charge, namely, a first high voltage preliminary charge by the voltage Ehp and a second high voltage by the voltage Ep which is lower than the voltage Ehp but higher than the measuring voltage Em, Also in this case, the open period can be shortened as in the embodiment of FIG. 12.

Figure 14:
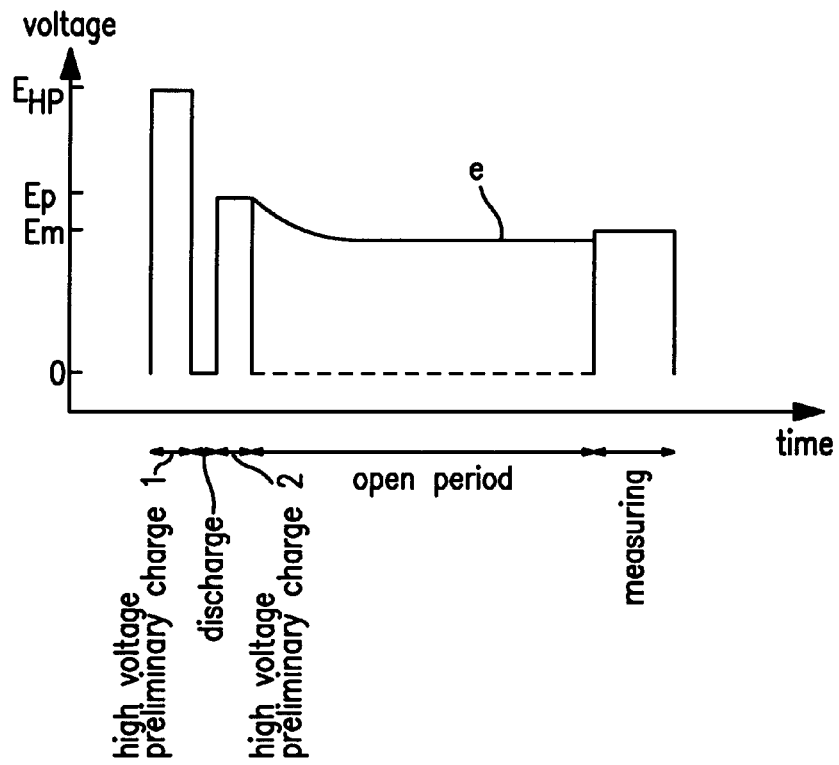
FIG. 14 is a view showing the voltage of both ends of a capacitor related to a time change in accordance with the tenth embodiment of the present invention.

FIG. 14 shows a modified embodiment of FIG. 12. In this embodiment, an electric discharge period is inserted between the first high voltage preliminary charge by the voltage Ehp and the second high voltage preliminary charge by the voltage Ep. Namely, since the electric discharge is performed just after the first high voltage preliminary charge, even if the voltage Ehp of high voltage preliminary charge is set higher than necessary, an unnecessary load is emitted by the electric discharge. Thus, it prevents the charged voltage from getting too high and measurement defects are prevented.

Figure 15:
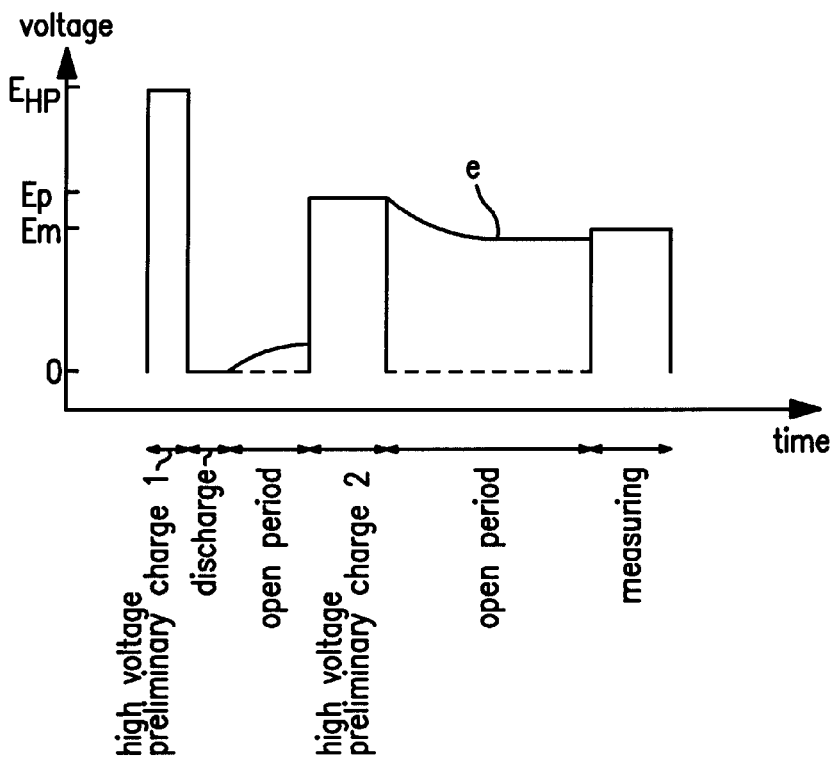
FIG. 15 is a view showing the voltage of both ends of a capacitor related to a time change in accordance with the eleventh embodiment of the present invention.

FIG. 15 shows a modified embodiment of FIG. 13. In this embodiment, an electric discharge period and an open period are inserted between the first high voltage preliminary charge by the voltage Ehp and the second high voltage preliminary charge by the voltage Ep. Also in this case, since the electric discharge is performed just after the first high voltage preliminary charge, even if the voltage Ehp of the high voltage preliminary charge is set higher than necessary, an unnecessary load can be emitted by the electric discharge, thereby preventing the measurement defects in measuring.

What is claimed is:

1. An insulation resistance measuring method comprising:
   preliminarily charging a capacitor with charge voltage Ep;
   waiting a period from an end of said preliminary charge;
   applying a measuring voltage Em to the capacitor after said waiting period; and
   measuring insulation resistance through a charging current flowing through the capacitor,
   wherein said waiting period from the end of the preliminary charge to the application of the measuring voltage Em is set to be a period in an open state and sufficient in duration for said capacitor to be subjected to a self-charge.

2. An insulation resistance measuring method according to claim 1, wherein the period $T_1$ of the preliminary charge is set to be a period of charging capacitance $C_0$ of a capacitor, in that a period $T_2$ from the end of the preliminary charge to the application of a measuring voltage Em is set to be a period in an open state, and in that a period $T_2$ in an open state is set to be a period in which the component D of dielectric polarization of the capacitor is self-charged.

3. An insulation resistance measuring method according to claim 1, wherein the period $T_1$ of the preliminary charge is set to be more than a period Tb which is a sum of a charging time A of capacitance of a capacitor and a transition time B of capacitance of a capacitor.

4. An insulation resistance measuring method according to claim 2, wherein the period $T_1$ of the preliminary charge is set to be more than a period Tb which is a sum of a charging time A of capacitance of a capacitor and a transition time B of capacitance of a capacitor.

5. An insulation resistance measuring method according to claim 1, wherein an open period $T_2$ of the self-charge is set to be more than a time period Tc in which the charging current reaches to a charge current value A1 flowing when a rated voltage is applied across insulation resistance R of a capacitor.

6. An insulation resistance measuring method according to claim 2, wherein an open period $T_2$ of the self-charge is set to be more than a time period Tc in which the charging current reaches to a charge current value A1 flowing when a rated voltage is applied across insulation resistance R of a capacitor.

7. An insulation resistance measuring method according to claim 3, wherein an open period $T_2$ of the self-charge is set to be more than a time period Tc in which the charging current reaches to a charge current value A1 flowing when a rated voltage is applied across insulation resistance R of a capacitor.

8. An insulation resistance measuring method according to claim 4, wherein an open period $T_2$ of the self-charge is set to be more than a time period Tc in which the charging current reaches to a charge current value A1 flowing when a rated voltage is applied across insulation resistance R of a capacitor.

9. An insulation resistance measuring method according to any one of claims 1 to 8, wherein a first preliminary charge is performed in the same voltage as the measuring voltage Em, a secondary preliminary charge is performed after a predetermined open period, and a measuring is performed afterwards.

10. An insulation resistance measuring method according to any one of claims 1 to 8, wherein the charge voltage Ep of the preliminary charge is set higher than the measuring voltage Em, and the charge voltage Ep is set so that a voltage e of both ends of the capacitor decreases to or less than the measuring voltage Em in the open period.

11. An insulation resistance measuring method according to any one of claims 1 to 8, wherein a first preliminary charge is performed at the voltage Ep which is higher than the measuring voltage Em, a secondary preliminary charge is preformed at the same voltage as the measuring voltage Em just before the measurement in the open period.

12. An insulation resistance measuring method according to any one of claims 1 to 8, wherein a first preliminary charge is performed at a voltage $E_{p1}$ which is higher than the measuring voltage Em, a secondary preliminary charge is performed at a voltage $E_{p2}$ which is lower than the voltage $E_{p1}$ and higher than the measuring voltage Em after a predetermined open period, the measuring is performed after a predetermined open period.

13. An insulation resistance measuring method according to claim 11, wherein an electric discharge is performed just after the first preliminary charge.

14. An insulation resistance measuring method according to claim 12, wherein an electric discharge is performed just after the first preliminary charge.

* * * * *